United States Patent
Sauciuc et al.

(10) Patent No.: US 7,742,299 B2
(45) Date of Patent: Jun. 22, 2010

(54) PIEZO FANS FOR COOLING AN ELECTRONIC DEVICE

(75) Inventors: Ioan Sauciuc, Phoenix, AZ (US); Sandeep Ahuja, Santa Clara, CA (US); Ashish Gupta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 12/118,338

(22) Filed: May 9, 2008

(65) Prior Publication Data

US 2009/0279255 A1 Nov. 12, 2009

(51) Int. Cl.
*H05K 7/20* (2006.01)

(52) U.S. Cl. .................. 361/695; 361/694; 361/719; 361/720; 174/16.1

(58) Field of Classification Search ................ None
See application file for complete search history.

(56) References Cited

U.S. PATENT DOCUMENTS

| | | | | |
|---|---|---|---|---|
| 6,123,145 A | * | 9/2000 | Glezer et al. | 165/104.33 |
| 7,023,697 B2 | * | 4/2006 | Pokharna et al. | 361/695 |
| 7,031,155 B2 | * | 4/2006 | Sauciuc et al. | 361/695 |
| 7,092,254 B1 | * | 8/2006 | Monsef et al. | 361/699 |
| 7,167,778 B2 | * | 1/2007 | Yazawa et al. | 700/300 |
| 7,248,475 B2 | | 7/2007 | Paydar et al. | |
| 7,321,184 B2 | * | 1/2008 | Lee et al. | 310/341 |
| 7,397,164 B1 | * | 7/2008 | Ali | 310/311 |
| 7,550,901 B2 | * | 6/2009 | Chrysler et al. | 310/330 |

FOREIGN PATENT DOCUMENTS

| | | | |
|---|---|---|---|
| JP | 62149158 A | * | 7/1987 |
| JP | 04065862 A | * | 3/1992 |

OTHER PUBLICATIONS

"Multi-Layer Piezoelectric Actuators with Conductive Polymer Electrodes", Ioan Sauciuc, et al., U.S. Appl. No. 11/694,762, filed Mar. 30, 2007.
"Dual Direction Rake Piezo Actuator", Javier Leija, et al., U.S. Appl. No. 11/731,749, filed Mar. 30, 2007.
"Piezoelectric Fan, Method of Cooling a Microelectronic Device Using Same, and System Containing Same", Hakan Erturk, et al., U.S. Appl. No. 11/828,759, filed Jul. 26, 2007.

* cited by examiner

*Primary Examiner*—Boris L Chervinsky
(74) *Attorney, Agent, or Firm*—Cool Patent, P.C.

(57) ABSTRACT

A cooling system including one or more piezo fans for an electronic assembly is disclosed. The electronic assembly may include heat-generating components coupled with a front side of a printed circuit board (PCB) and one or more piezo fans coupled with a back side of the PCB. One or more piezo fans may be capable of cooling the heat-generating components from the back side. The cooling system may further include a heat sink coupled with the back side of the PCB.

19 Claims, 6 Drawing Sheets

PIEZO FANS FOR COOLING AN ELECTRONIC DEVICE

BACKGROUND

As silicon technology goes through process changes such as from 90 nm to 65 nm to 45 nm, it becomes possible to run the central processing unit (CPU) cores at a lower voltage. However, the total power consumption in the CPU stays the same at approximately 130 W. These conditions lead to higher current in sockets, solder balls, voltage regulators, and/or other components on a motherboard, which in turn, increases self heating. Excessive self heating can reduce socket and solder ball joint reliability and degrade CPU performance.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

DETAILED DESCRIPTION

Figure 1:
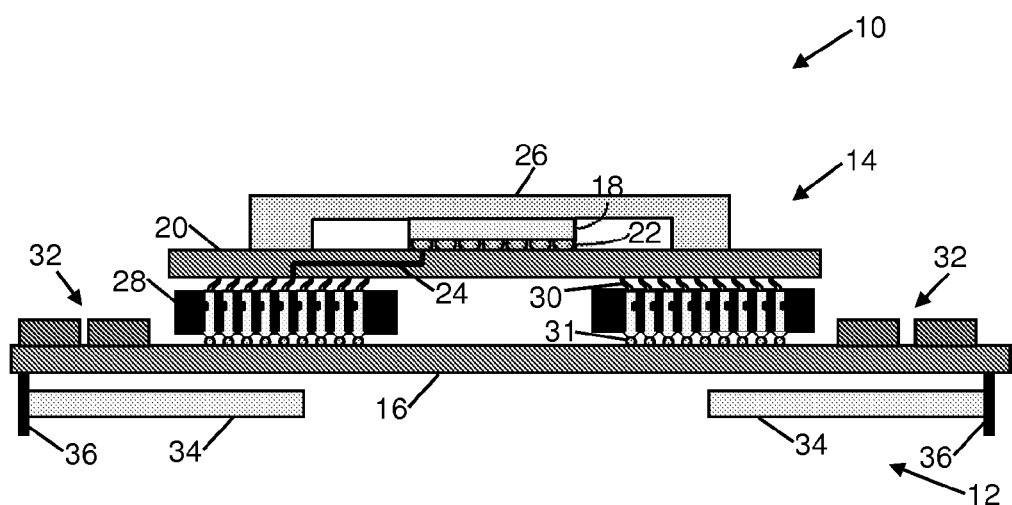
FIG. 1 is a cross-sectional diagram of a computer assembly including a cooling system according to one embodiment.

Referring to FIG. 1, a cross-sectional diagram of a computer assembly 10 including a cooling system 12 according to one embodiment is shown. Although FIG. 1 shows a computer assembly 10, in one or more embodiments, the disclosed subject matter is not limited to a computer system, wherein other non-computer related systems may likewise be utilized, and the scope of the claimed subject matter is not limited in this respect. The computer assembly 10 may include an integrated circuit (IC) package 14 coupled to a printed circuit board (PCB) 16. The package 14 includes an IC, die or chip 18 attached to a package substrate 20 using a set of connectors such as controlled collapse chip connect (C4) bumps 22. Alternatively, other types of connectors in electrical connection systems may be used. The die 18 may be a microprocessor, microcontroller, application specific integrated circuit (ASIC), field programmable gate array (FPGA), digital signal processor (DSP), memory, input/out (I/O) controller or hub, etc. The package substrate 20 has connections 24 to the die 18 coupled to ground, power and signaling planes within the substrate 20. The package substrate 20 may be formed from any rigid dielectric substrate, such as a standard printed circuit board (PCB) material. For example, the substrate material may include FR-4 epoxy-glass, polyimide-glass, benzocyclobutene, other epoxy resins, injection-molded plastic or the like, and ceramic.

The package 14 may be a chip carrier configured to protect the IC 18 and may include a cover 26 coupled to the package substrate 20. The cover 26 may form an internal enclosure to surround and protect the die 18 against the external environment. The cover 26 may be hermetically sealed to the package substrate 20. For example, the cover 26 may be an integrated heat spreader (IHS). Package 14 may include a bottom surface with contact pads (not shown) for coupling to the PCB 16. The contact pads are capable of coupling to pins located on a socket 28 coupled to the PCB 16.

As shown in FIG. 1, the computer assembly 10 may further include a land grid array (LGA) socket 28 which contains pins or lands 30 arranged in an array for coupling with pads on the bottom surface of the package 14. The socket 28 may be coupled with the PCB 16 via solder balls 31. The socket 28 may include other means for coupling the package 14 to the PCB 16. The socket 28 may further include power, ground and signaling connectors or a subset of such connectors.

The PCB 16 may be a conventional PCB, a printed wiring board (PWB), a motherboard, a daughtercard, a cartridge substrate, a flexboard or any other substrate which may carry the package 14. In one embodiment, the motherboard 16 may be the primary circuit board in a computer system. The motherboard 16 may carry a CPU, memory controller hub (MCH), I/O controller hub (ICH), universal serial bus (USB) hub, read-only memory (ROM), flash memory, graphics controller, super I/O (SIO) port, integrated drive electronics (IDE) bus, peripheral component interconnect (PCI) bus, accelerated graphics port (AGP) bus, low pin count (LPC) bus, one or more peripheral devices, integrated device such as a system on a chip (SOC), and/or other components. The motherboard 16 may further carry one or more voltage regulators 32. The voltage regulators 32 and other components on the motherboard 16 may generate and/or retain heat and cause the PCB 16 to rise in temperature.

The cooling system 12 of the computer assembly 10 may be capable of circulating air beneath the PCB 16 and thus cooling the bottom surface ("back side") of the PCB 16, the PCB 16 itself, and various components that may be located on the top surface ("front side") of the PCB 16. It should be noted that back side of PCB 16 may refer to a secondary side of PCB 16 in general, and not limited to the bottom surface of PCB 16. Similarly, the front side of PCB 16 may refer to a primary side of PCB 16 where most of the components are mounted in general, and not limited to the top surface of PCB 16. For example, these references may be useful if the PCB 16 was oriented vertically or in such a way that the top and bottom surfaces are not easily distinguishable. However, although the terms back side, bottom surface, beneath, under, below, etc. and/or front side, top surface, above, top, etc, may be used herein for purposes of discussion, the claimed subject matter is not limited in these respects.

The cooling system 12 may include one or more piezo fans 34 coupled with the back side of the PCB 16. One or more piezo fans 34 may be selectively positioned with respect to the back side of the PCB 16. One or more piezo fans 34 may also be selectively oriented on the back side of the PCB 16. In general, piezo fans 34 may be in any feasible orientation, and is not limited to what is disclosed in the figures. For example, piezo fan 34 may be oriented perpendicular to the PCB 16 if space allows and parallel to the PCB 16 if space is constrained, however the claimed subject matter is not limited in these respects. The selected position(s) and orientation(s) of one or more piezo fans 34 is further described below.

The piezo fans 34 may be coupled to the PCB 16 via an attachment mechanism 36. The attachment mechanism 36 may be capable of securing one or more piezo fans 34 in selected position(s) and/or orientation(s) with respect to the back side of the PCB 16. The attachment mechanism 36 may include a standoff, spacer, fastener, adhesive, mounting hole, etc., and may be adjustable and/or removable. For example, the attachment mechanism 36 may be formed integrally with the piezo fan 34 or as a receptacle on the PCB 16 for receiving the piezo fan 34.

Figure 2:
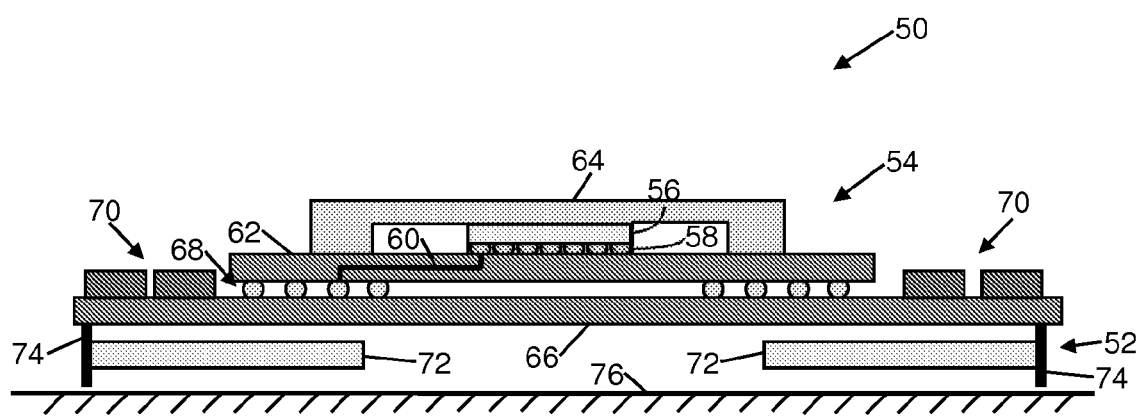
FIG. 2 is a cross-sectional diagram of another computer assembly including a cooling system according to one embodiment.

FIG. 2 is a cross-sectional diagram of another computer assembly 50 including a cooling system 52 according to one embodiment. The computer assembly 50 may include a ball grid array (BGA) package 54 coupled with a PCB 66. The BGA package 54 includes an IC, die or chip 56 with C4 bumps 58 or other connectors coupling the die 56 to a package substrate 62. The BGA package 54 may include connections 60 in package substrate 62 allowing signals to travel from die 56 to PCB 66. An array of electrical contact pads (not shown) disposed about the bottom surface of package substrate 62 may include solder balls 68 that extend from the array. The solder balls 68 may be soldered to package substrate 62 to electrically and mechanically couple the package 54 to PCB 66. The solder balls 68 may be connected to power, ground, and/or signal connections. It will be appreciated that computer assembly 50 may include packages such as pin grid array (PGA), column grid array (CGA), and other packages using any of a variety of solder reflow technologies in addition to the land grid array (LGA) package of FIG. 1 and the ball grid array (BGA) package of FIG. 2.

Similar to FIG. 1, the PCB 66 may be a substrate capable of carrying one or more components including one or more voltage regulators 70 on a front side. Also similar to FIG. 1, cooling system 52 may include one or more piezo fans 72 positioned beneath the PCB 66. The piezo fans 72 may be coupled to the PCB 66 via an attachment mechanism 74. The attachment mechanism 74 may be capable of coupling one or more piezo fans 72 in a selected position and orientation with respect to the back side of the PCB 66.

In addition, FIG. 2 depicts a chassis 76 in which computer assembly 50 may be mounted. In general, without a cooling system, this region between PCB 66 and chassis 76 is cooled by natural convention which is suppressed by the enclosure. According to one embodiment, the cooling system 52 may be capable of circulating airflow between PCB 66 and chassis 76. Depending on how the computer assembly 50 is coupled to the chassis 76 and the space available in between, the height of the attachment mechanism 74 and the height of one or more piezo fans 72 may be limited. For example, between the PCB 66 and chassis 76, there may be a gap of 3 mm-4 mm. In an alternative embodiment, the computer assembly 50 may be mounted on another PCB, and cooling system 52 may be sandwiched in between two PCBs. The cooling system 52 may be capable of circulating airflow between the two PCBs.

Figure 3:
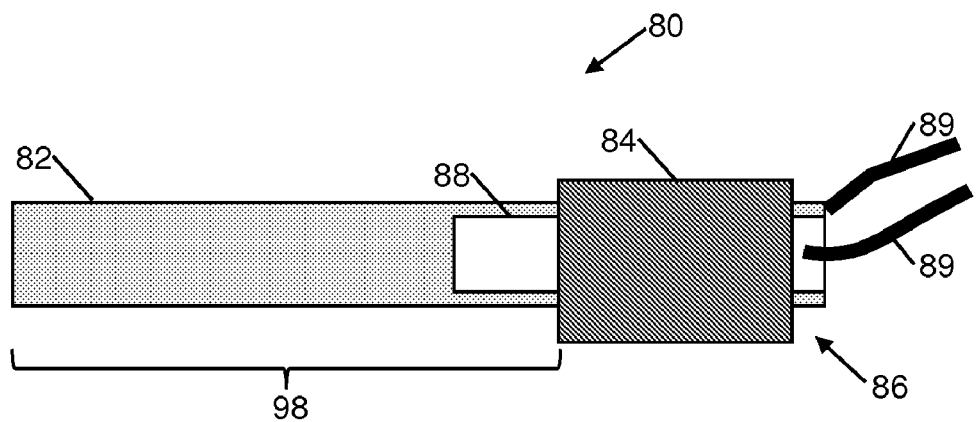
FIG. 3 is a side view of a piezo fan according to one embodiment.
Figure 4:
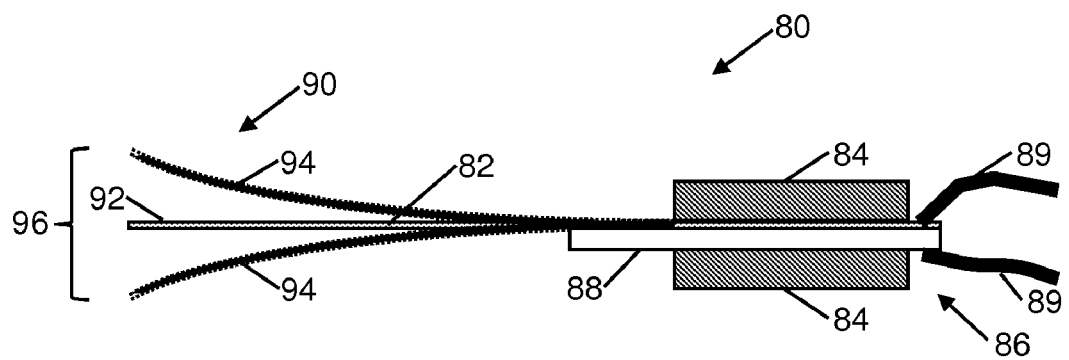
FIG. 4 is a top view of the piezo fan of FIG. 3.

Referring to FIGS. 3 and 4, a side view of a piezo fan 80 is shown in FIG. 3 and a top view of the piezo fan 80 is shown in FIG. 4, according to one embodiment. Note that the figures herein are not drawn to scale and are for purposes of example and discussion. The piezo fan 80 may include a blade 82, a jig 84, and a piezo actuator 86. The blade 82 may be coupled to the piezo actuator 86 and may be capable of generating airflow by swinging back and forth in response to the piezo actuator 86. The jig 84 may securely couple the blade 82 to the piezo actuator 86, such as by clamping. The jig 84 may be further capable of coupling the piezo fan 80 to the back side of a PCB.

The piezo actuator 86 may include a piezo element 88 capable of deforming in response to an applied electric field. The piezo element may be a layer of piezoelectric material capable of being bonded or physically coupled to one end of the blade 82. As a non-limiting example, the piezo element may be 0.3 mm thick, and have a height of 1.5 mm. The piezo element 88 may extend over a portion of the blade 82. For example, the piezo element 88 may be in physical contact with approximately one quarter of the length to approximately half of the length of the blade 82, but the scope of the claimed subject matter is not limited in these respects.

The piezo element 88 may be comprised of a piezoelectric material. As non-limiting examples, the piezoelectric material may include BNT-based ($Bi_{0.5}Na_{0.5}TiO_3$) crystals, barium titanate ($BaTiO_3$), lead zirconate titanate (PZT), lead titanate ($PbTiO_3$), potassium niobate ($KNbO_3$), lithium niobate ($LiNbO_3$), lithium tantalate ($LiTaO_3$), sodium tungstate ($Na_xWO_3$), other crystals and ceramics exhibiting piezoelectric effects, polyvinylidene fluoride (PVDF), and other materials capable of deforming in response to an electric field.

The piezo actuator 86 may be capable of drawing an alternating current from a power supply (not shown) on a PCB to apply an electric field to the piezo element 88. The piezo actuator 86 may include wires 89 for connecting to the power supply. When the piezo element 88 is placed under the electric field, randomly oriented ions may align and cause opposite charges to build on opposing sides resulting in deformation of the piezo element 88. Under an alternating current, the electric field may change at the same frequency as the alternating current causing the piezo element 88 to deform to one side and then to the other at the same frequency. Because the blade 82 is flexible and coupled to the piezo element 88, the blade 82 swings back and forth in accordance with deformation of the piezo element 88.

Referring specifically to FIG. 4, a depiction of the full, or nearly full, range of movement of blade 82 is shown at 90. The figure shows blade 82 in a resting position at 92 when the piezo actuator 86 is not supplied power or not turned on. The full range of movement 90 includes two extreme positions of blade 82 as indicated at 94 when the piezo actuator 86 is supplied power or turned on. The distance 96 traveled by the back and forth motion of the blade 82 may be referred to as "vibration width" or "blade stroke". For example, the blade stroke 96 may be 26 mm. The blade stroke 96 may have a maximum amplitude, which may depend on a number of parameters, for example, power supplied to the piezo actuator 86 and resonant frequency of the piezo actuator 86, further described below.

In one embodiment, the blade 82 may be a flexible thin rectangular plate that is fixed at one end, the same end to which piezo actuator 86 is coupled. The length of the blade 82 may extend beyond the length of the jig 84. Blade 82 may include a hold position 98 which is the lengthwise distance from a free end of the blade 82 to the jig 84. As a non-limiting example, the hold position 98 may range from 20 mm to 50 mm. The blade 82 may be sufficiently thin to flex in response to deformation of the piezo element 88 and thick enough to maintain structural integrity. The height may be sufficient in length to create airflow when the blade 82 vibrates. As mentioned above, in one embodiment, the height of the piezo fan 80 or blade 82 may be limited by the amount of space available between a PCB and a chassis, or between a PCB and another PCB. For example, the height of blade 82 may range from 1 mm to 4 mm. As another example, the dimensions of the blade 82 may be 0.1 mm thick, 2 mm in height, and 45 mm in length, but the claimed subject matter is not limited in these respects. The shape and dimensions of the blade 82 may vary and may be selected for a selected heat transfer coefficient, as further described below.

The movement of the blade 82 may create a unidirectional flow stream. Maximum airflow may occur along a lengthwise direction. Air intake is above and below a swept out volume of the blade 82, thus the piezo fan 80 may circulate airflow and disturb boundary layers to increase thermal dissipation. To increase airflow, the piezo fan 80 may be configured to create large amplitude in the movement of the blade 82, and/or maximize blade stroke 96. In one embodiment, supplying a greater voltage may produce a larger amplitude. At the resonant frequency of the piezo actuator 86 and blade 82, the piezo fan 80 may create the maximum amplitude. For example, piezo fan 80 may vibrate at a frequency of 46 Hz. It should be noted that the resonant frequency and amplitude may be different due to variations in parameters.

In some embodiments, the blades of the piezo fans of FIGS. 3-4 and FIG. 5 as described below may begin vibrating upon being supplied power, for example, 7 mW. The piezo fans may be arranged such that no initial start-up period or power surge occurs. If the piezo fans require more power than a PCB or motherboard can provide, the wires 89 of the piezo fans may be coupled with an alternate power supply. A controller may selectively actuate and control the piezo fans. For example, the controller may turn on one or more piezo fans in response to a temperature reading.

Figure 5:
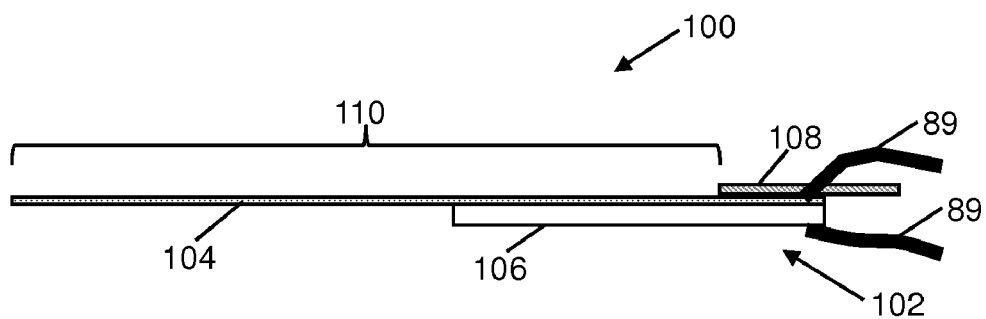
FIG. 5 is a top view of a piezo fan according to another embodiment.

FIG. 5 is a top view of a piezo fan 100 according to another embodiment. As shown, the piezo fan 100 may be arranged without a jig coupling a piezo actuator 102 and blade 104 together. The blade 104 may be sufficiently bonded to a piezo element 106 on the piezo actuator 102 and capable of flexing back and forth to generate airflow. The piezo fan 100 may include an attachment mechanism 108 capable of coupling to one end of the blade 104 and/or the end of the piezo element 106. The attachment mechanism 108 may be arranged to couple the piezo fan 100 to the back side of a PCB, as mentioned above. Blade 104 may include a hold position 110 which is the lengthwise distance from a free end of the blade 104 to the attachment mechanism 108. Similar to FIGS. 3-4, as a non-limiting example, the hold position 110 may range from 20 mm to 50 mm. In other respects, piezo fan 100 may operate similarly to piezo fan 80 and may be configured with the same or similar attributes.

Figure 6:
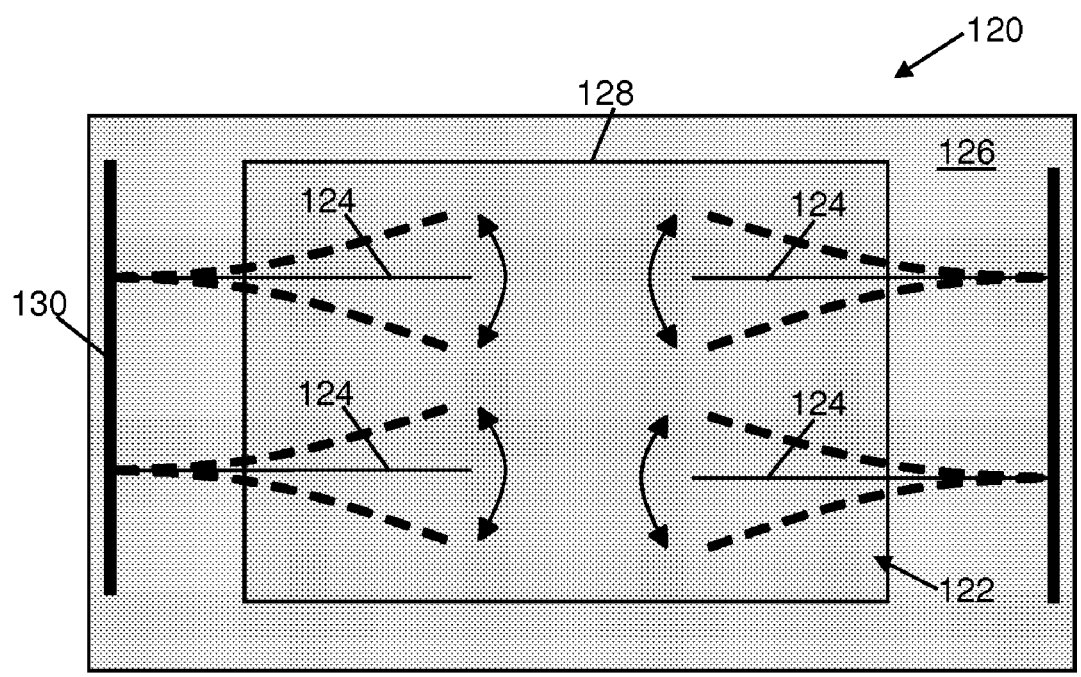
FIG. 6 is a diagram of a bottom view of a computer assembly and cooling system according to one embodiment.

FIG. 6 is a diagram of a bottom view of a computer assembly 120 and a cooling system 122 according to one embodiment. The cooling system 122 may include one or more piezo fans 124 capable of circulating airflow and coupled to the back side of a PCB 126. In the figure, the PCB 126 includes a box 128 indicating a socket or package shadow. The socket shadow 128 may represent where a socket is positioned on the front side of PCB 126. When a BGA package is used, the package shadow 128 may represent where a package is positioned on the front side of PCB 126.

Figure 7:
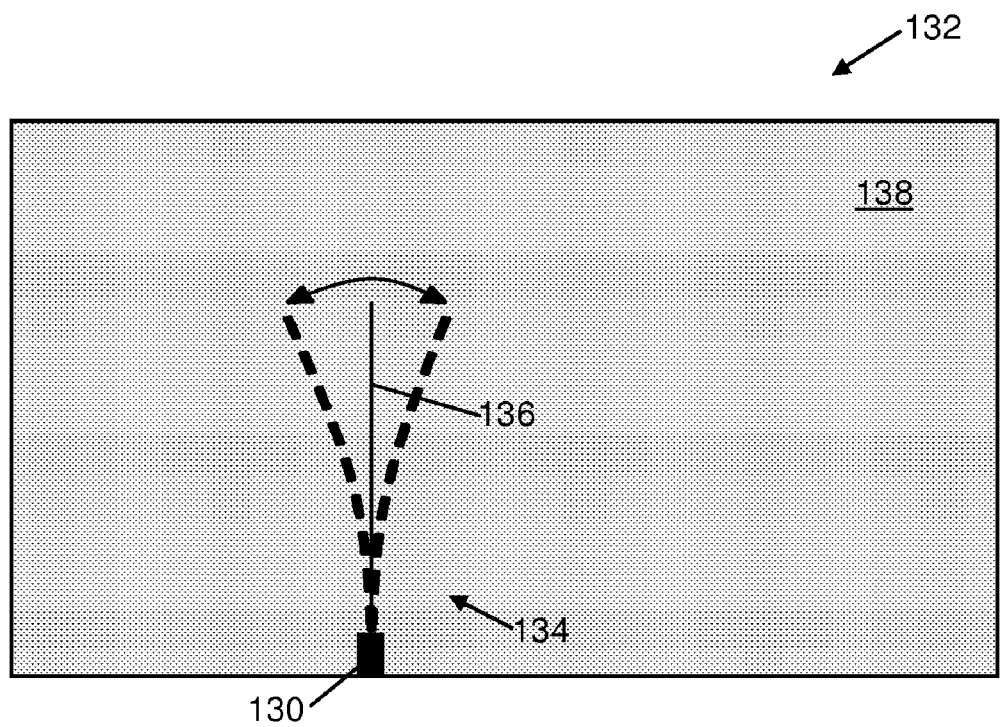
FIG. 7 is a diagram of a bottom view of a computer assembly and cooling system according to another embodiment.

In one embodiment, the piezo fans 124 may be oriented substantially parallel to the PCB 126 and capable of increasing back side cooling to the computer assembly 120. In FIG. 6, the piezo fans 124 are located at a predetermined position beneath the socket or package. The dashed lines and corresponding arrows indicate the range of movement and vibration of the piezo fans 124, respectively. The piezo fans 124 may be positioned proximate any component capable of generating heat, retaining heat, and/or dissipating heat (herein referred to as "heated component", and coupled to the front side of PCB 126. For example, the piezo fans may be beneath, at least partly beneath, or at a predetermined distance from the heated component. The positions of the piezo fans 124 may be selected to target heated components to increase cooling. For example, if a particularly hot component is coupled to the PCB 126, a piezo fan may be specifically positioned with respect to the location of the component to yield a selected heat transfer coefficient, as shown in FIG. 7 below. It should be noted that a heated component may include any heat-generating and/or heat-retaining component.

The cooling system 122 may further include attachment mechanisms 130 for coupling one or more piezo fans 124 to the PCB 126. In one embodiment, more than one piezo fan 124 may share one attachment mechanism 130.

FIG. 7 is a diagram of a bottom view of a computer assembly 132 and a cooling system 134 according to another embodiment. The embodiment of FIG. 7 is similar to the embodiment of FIG. 6, except for the locations of the piezo fans 124. Cooling system 134 may include one or more piezo fans 136 capable of circulating airflow and coupled to the back side of a PCB 138. In one embodiment, cooling system 134 includes one piezo fan 136 targeting cooling of one component located on the front side of the PCB 138. The dashed lines and corresponding arrow indicate the range of movement and vibration of the piezo fan 136, respectively. To cool a hot spot such as one created by a heated component on PCB 138, the piezo fan 136 may be located proximate the component for a selected heat transfer coefficient. Hot spots may also refer to a region where heat accumulates on a PCB.

It will be appreciated that FIGS. 6 and 7 are depictions of example placement positions of piezo fans. Although the piezo fans are shown as identical devices, the piezo fans may vary depending on the application. For example, the piezo fans may have different sizes, shapes, orientations and/or other parameters. The cooling system 122 of FIG. 6 includes four piezo fans and the cooling system 134 of FIG. 7 includes a single piezo fan, however any number of piezo fans may be selected and used.

Figure 8:
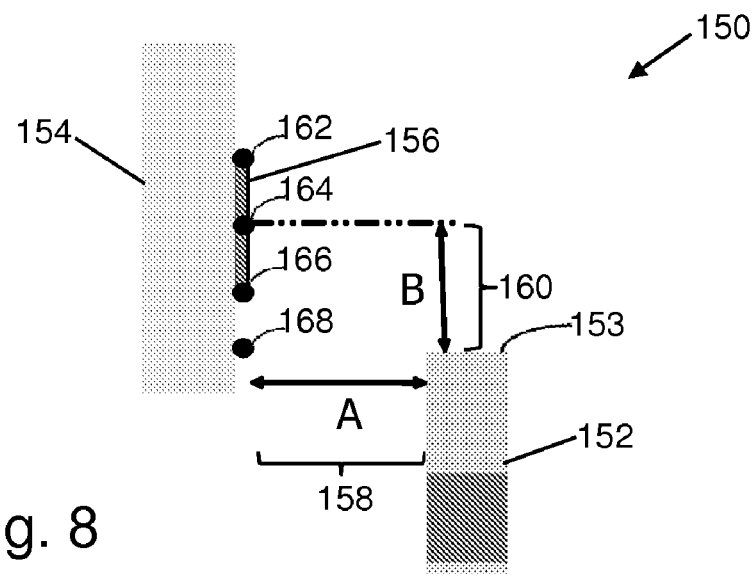
FIG. 8 is a diagram of a piezo fan in a test set-up with the piezo fan oriented parallel to a circuit board.

Referring to FIG. 8, a diagram of a piezo fan 152 in a test set-up is shown at 150. The results are plotted in FIG. 9 and discussed below. In an enclosed experimental set-up 150 with the piezo fan 152 oriented parallel to a circuit board 154, a die 156 is used as a reference location for measurement of heat. Specifically, the heat transfer coefficient may be computed from a reference point 164. The piezo fan 152 is positioned with respect to the reference point 164. The piezo fan 152 includes a free end 153 which aligns in a lengthwise direction with various points 162, 164, 166, and 168 on circuit board 154. Along the lengthwise direction, the various points correspond to a lengthwise distance 160, also referred to as "B", from reference point 164. At B=6 mm, the free end 153 of the piezo fan 152 aligns with point 162; at B=0 mm, the free end 153 aligns with point 164; at B=−6 mm, the free end 153 aligns with point 166; and at B=−12 mm, the free end 153 aligns with point 168. Along the piezo fan height-wise direction, a distance 158, referred to as "A", separates the piezo fan 152 from the circuit board 154. At A=5 mm, the piezo fan 152 is 5 mm apart from the die 156; and at A=0 mm, the piezo fan 152 is 0 mm apart from the die 156. In FIG. 8, the piezo fan 152 is depicted as being positioned at A=5 mm and B=−12 mm.

Figure 9:
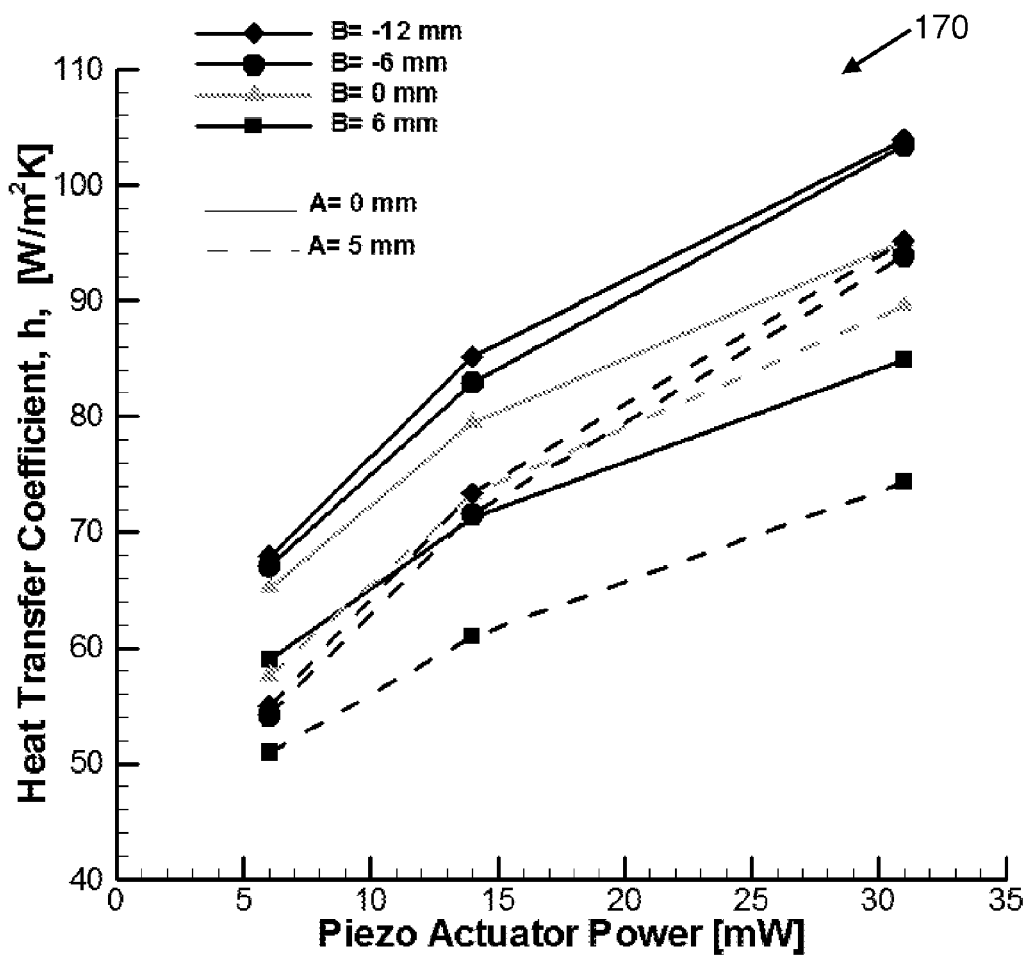
FIG. 9 is a plot showing heat transfer coefficient versus piezo actuator power.

Referring to FIG. 9, heat transfer coefficient versus piezo actuator power is plotted at 170. In the experimental set-up 150, the piezo fan 152 was placed in eight different positions (A=0 mm, B=6 mm), (A=0 mm, B=0 mm), (A=0 mm, B=−6 mm), (A=0 mm, B=−12 mm), (A=5 mm, B=6 mm), (A=5 mm, B=0 mm), (A=5 mm, B=−6 mm), (A=5 mm, B=−12 mm), and supplied with three different power values from a power supply (6 mW, 14 mW, 30 mW) at each position. Plot 170 shows the resulting heat transfer coefficients plotted against the piezo actuator power consumed. As shown, higher heat transfer coefficients result from piezo fan positions that are a height-wise distance closer to circuit board 154. The heat transfer coefficients may also vary depending on other variable parameters, and may be selected accordingly for a particular application.

In selecting piezo fans and the respective placement locations for piezo fans, heat transfer coefficients may also be considered. The heat transfer coefficient may vary with blade length, blade height, distance, amplitude, and/or power. For example, higher heat transfer coefficients ranging from 70 W/m²K-100 W/m²K may be feasibly selected. Modeling data has shown that piezo fans selected with higher heat transfer coefficients can decrease temperature on a PCB by greater than 30 degrees and decrease solder ball temperature by greater 10 degrees, as compared to a computer assembly without piezo fans, at a heat transfer coefficient of 10 W/m²K.

Figure 10:
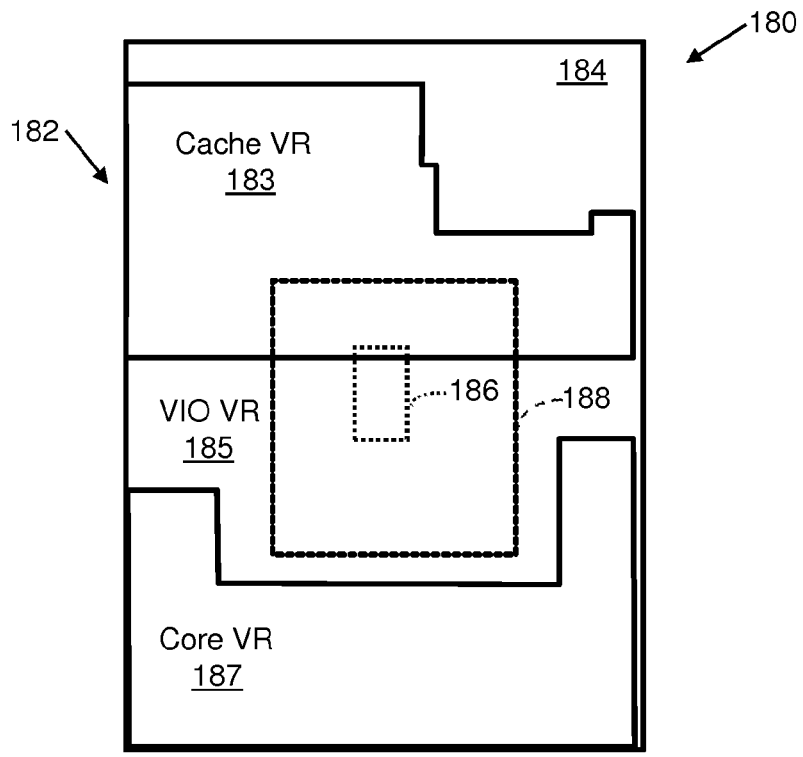
FIG. 10 is a top view of a computer assembly showing locations of some components.

FIG. 10 is a top view of a computer assembly 180 showing locations of some components, which may be located on the front side of a PCB 184. Computer assembly 180 may include one or more voltage regulators (VRs) 182 coupled to PCB 184 and capable of taking an input voltage of some value and outputting a stable voltage of a different value. VR 182 may support the voltage, current, and frequency requirements of a die 186 and other components such as socket 188 on PCB 184. For example, VR 182 may be a voltage regulator module (VRM) which is a programmable voltage regulator capable of taking a set of voltage identification signals (VID) that are coded to generate a precise voltage. These VID pins may be driven by a processor.

In one embodiment, the VR 182 may receive a 12 V supply from a main power supply and convert the voltage to multiple 1 V supplies to supply power to different parts of the die 186 or PCB 184. Control lines may enable, disable and adjust the voltages. The die 186 such as a processor may have a single voltage input with Vcc, Vss, and ground or the die 186 may have multiple cores configured with the same or different voltages. Power conversion from the voltage regulators 182 may allow quick changes in power settings. Since the processor may run at 130 W and the total power running through a socket may be 250 W, significant heat may be generated. Generally, heat sinks may be placed on top of the VRs 182 for heat removal.

VRs 182 may be located anywhere surrounding socket 188. VR 182 may be associated with certain components or functions. Examples of VRs 182 may include cache VRs 183, voltage input/output VRs (VIO VRs) 185, and core VRs 187.

In one or more embodiments disclosed above, the cooling system including one or more piezo fans may be used to cool processors, chips, sockets, pins, solder balls, chipsets, vias, traces, connections, heat sinks, VRs and/or other components coupled to the PCB that generate, dissipate, and/or retain heat. The cooling system may be capable of increasing airflow to the back side of the PCB, thus allowing heat removal from the back side of the PCB. Further, the cooling system may obviate the need for heat sinks on top of heated components.

As mentioned above, one or more components on the PCB may be targeted for cooling. For example, targeting solder balls for cooling may lead to greater solder joint reliability. Targeting one or more components for cooling may include selecting placement locations and parameters for one or more piezo fans.

Figure 11:
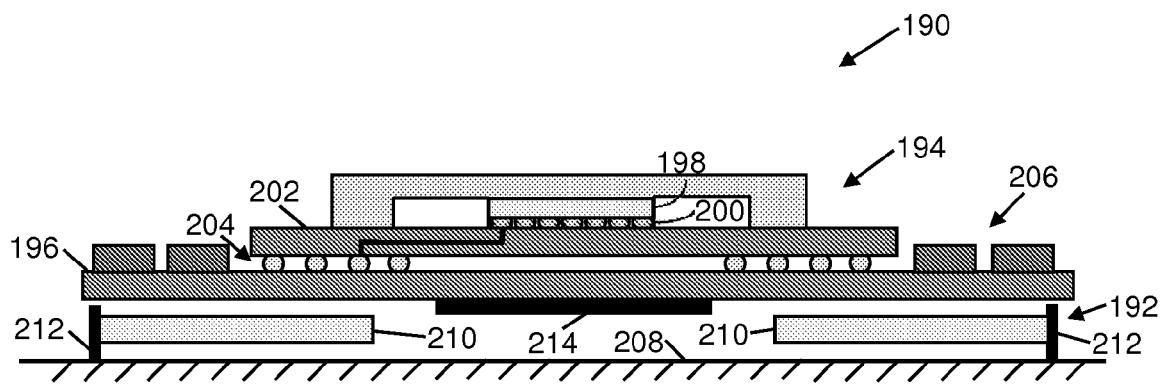
FIG. 11 is a cross-sectional diagram of a computer assembly including a cooling system according to another embodiment.

FIG. 11 is a cross-sectional diagram of a computer assembly 190 including a cooling system 192 according to another embodiment. Similar to FIG. 2, the computer assembly 190 may include a ball grid array (BGA) package 194 coupled with a PCB 196. The BGA package 194 includes an IC, die or chip 198 with C4 bumps or other connectors 200 coupling the die 198 to a substrate 202. The BGA package 194 may include substrate 202 capable of providing connections between the die 198 and the PCB 196. The BGA package 194 may include one or more solder balls 204 that extend from an array of contact pads disposed on the bottom surface of substrate 202. The solder balls 204 may be soldered to substrate 202 to electrically and mechanically couple the package 194 to PCB 196. The package 194 may use other solder reflow technologies.

Similar to FIG. 1, the PCB 196 may be a substrate capable of carrying one or more heated components including one or more voltage regulators 206 on a front side. The PCB 196 may be coupled with a chassis or an adjacent PCB 208 capable of supporting the computer assembly 190. The cooling system 192 may include one or more piezo fans 210 positioned beneath the PCB 196 and oriented substantially parallel to the PCB 196. One or more piezo fans 210 may be coupled to the PCB 196 via an attachment mechanism 212. Alternatively, as shown in FIG. 11, the attachment mechanism 212 may couple one or more piezo fans 210 to the chassis or the adjacent PCB 208. The attachment mechanism 212 may be capable of positioning one or more piezo fans 210 in selected location(s) and/or orientation(s) with respect to a back side of the PCB 196. The region between PCB 196 and chassis or adjacent PCB 208 may be cooled by the cooling system 192 which is capable of circulating airflow in the region, therefore PCB 196 and heated components may be cooled from the back side.

In another aspect, the computer assembly 190 may further include a heat sink 214 positioned beneath the PCB 196. Heat sink 214 may be made of a material with thermal conductivity, for example, copper, other metals, etc. The heat sink 214 conducts heat from the PCB 196 into the ambient air beneath the PCB 196. In one embodiment, the heat sink 214 may be approximately 1 mm thick. A thermally conductive material or a thermal interface material (TIM) may be applied between the heat sink 214 and the PCB 196 to minimize thermal resistance. For example, thermal grease may be used including silicone oil with aluminum oxide, zinc oxide, boron nitride, colloidal silver, etc. TIM may also include other grease, metallic foil, metal-impregnated paste, metal or polymer solder, etc.

In one embodiment, the heat sink 214 may be coupled to the PCB 196 beneath or at least partly beneath a targeted component that is coupled to the front side of the PCB 196. The targeted component may be any component on the PCB 196 that may be selected for cooling. The heat sink 214 may also be placed beneath a hot spot to increase cooling. One or more piezo fans 210 may circulate airflow over the heat sink 214 and increase heat removal due to increased convection.

Figure 12:
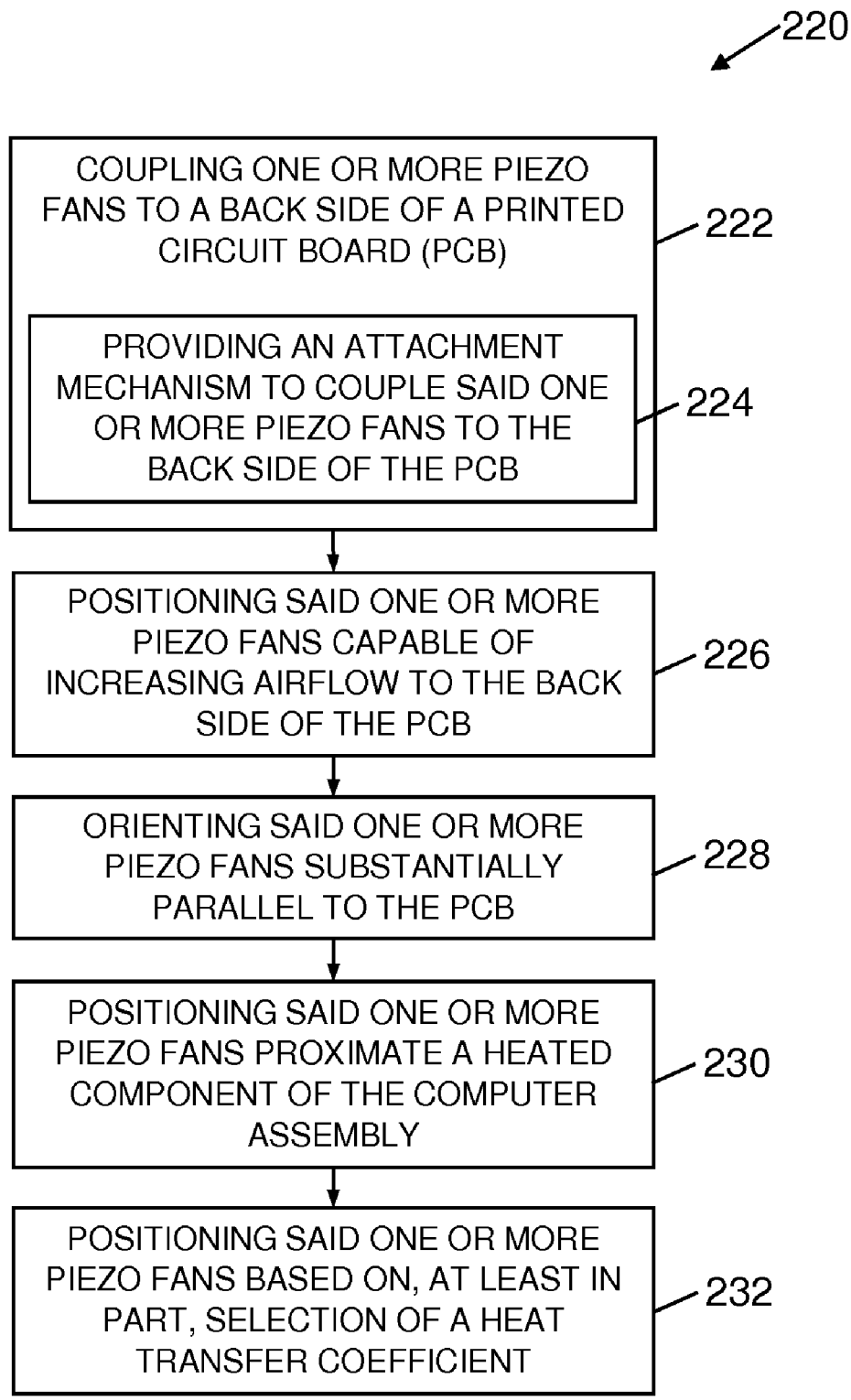
FIG. 12 is a flowchart of a method of cooling an electronic device according to one embodiment.

FIG. 12 is a flowchart of a method 220 of cooling an electronic device according to one embodiment. The cooling method 220 may include, at 222, coupling one or more piezo fans to a back side of a printed circuit board (PCB) in the electronic device. In coupling one or more piezo fans to the back side of a printed circuit board (PCB), the cooling method 220 may include, at 224, providing an attachment mechanism to couple one or more piezo fans to the back side of the PCB.

In one embodiment, the attachment mechanism may couple one or more piezo fans to a chassis or an adjacent PCB. At 226, the cooling method 220 may include positioning one or more piezo fans capable of increasing airflow to the back side of the PCB. One or more piezo fans may include a blade coupled to a piezo element and capable of flexing in response to deformation of the piezo element. The blade(s) of one or more piezo fans may vibrate in response to deformation of the piezo element. Method 220 may include, at 228, orienting one or more piezo fans substantially parallel to the PCB. One or more piezo fans may also be oriented otherwise depending on the application. The cooling method 220 may further include, at 230, positioning one or more piezo fans proximate a heated component including any heat-generating, heat-dissipating, and/or heat-retaining component of the electronic device. The cooling method 220 may further include, at 232, positioning one or more piezo fans based on, at least in part, selection of a heat transfer coefficient.

It is appreciated that piezo fans for cooling an electronic device has been explained with reference to one or more exemplary embodiments, and that the claimed subject matter is not limited to the specific details given above. References in the specification made to other embodiments fall within the scope of the claimed subject matter.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the claimed subject matter is not limited to the details described above. Rather, it is the following claims including any amendments thereto that define such scope and variations.

What is claimed is:

1. A cooling system for an electronic device, the cooling system comprising:
   one or more piezo fans coupled to a first side of a printed circuit board (PCB) capable of carrying one or more heated components coupled to a second side of the PCB; and
   one or more attachment mechanisms coupling said one or more piezo fans to the first side of the PCB;
   wherein said one or more piezo fans are capable of increasing airflow to the first side of the PCB and cooling said one or more heated components.

2. The cooling system of claim 1 wherein the PCB comprises a motherboard and the electronic device comprises a processor disposed in a package coupled to the motherboard.

3. The cooling system of claim 1 wherein said one or more heated components comprises one or more voltage regulators.

4. The cooling system of claim 3 wherein said one or more piezo fans are located near said one or more voltage regulators.

5. The cooling system of claim 1 wherein said one or more piezo fans are located near at least one of a socket or solder balls coupled to the PCB.

6. The cooling system of claim 1 wherein said one or more piezo fans comprises a blade capable of vibrating in response to a piezo actuator coupled to the blade.

7. The cooling system of claim 6 wherein a height of the blade is less than the distance between the first side of the PCB and a chassis of the electronic device.

8. The cooling system of claim 6 wherein a height of the blade is less than the distance between the first side of the PCB and an adjacent PCB.

9. The cooling system of claim 6 wherein a height of the blade ranges from about 1 mm to about 4 mm.

10. The cooling system of claim 6 wherein the blade is oriented substantially parallel to the PCB.

11. A cooling method for a computer assembly, the method comprising:
    coupling one or more piezo fans to a first side of a printed circuit board (PCB); and
    positioning said one or more piezo fans capable of increasing airflow to the first side of the PCB;
    wherein said one or more piezo fans comprises a blade coupled to a piezo element and capable of flexing in response to deformation of the piezo element; and
    wherein one or more heated components are coupled to a second side of the PCB.

12. The cooling method of claim 11 wherein said coupling one or more piezo fans to a first side of a PCB comprises providing an attachment mechanism to couple said one or more piezo fans to the first side of the PCB.

13. The cooling method of claim 11 further comprising orienting said one or more piezo fans substantially parallel to the PCB.

14. The cooling method of claim 11 further comprising positioning said one or more piezo fans near a heated component of the computer assembly.

15. The cooling method of claim 11 wherein further comprising positioning said one or more piezo fans based on, at least in part, selection of a heat transfer coefficient.

16. An electronic assembly comprising:
    a printed circuit board (PCB) comprising a first side and a second side;
    a die or a socket coupled with the first side of the PCB; and
    one or more piezo fans coupled with an attachment mechanism capable of positioning said one or more piezo fans on the second side of the PCB.

17. The electronic assembly of claim 16 wherein said one or more piezo fans are capable of cooling the die or the socket, or combinations thereof.

18. The electronic assembly of claim 16 further comprising a heat sink coupled to the second side of the PCB.

19. The electronic assembly of claim 16 further comprising an additional PCB coupled to the second side of the PCB, wherein said one or more piezo fans are sandwiched in between the PCB and the additional PCB.

* * * * *